(12) United States Patent  
Heismann et al.

(10) Patent No.: US 9,057,770 B2  
(45) Date of Patent: Jun. 16, 2015

(54) METHOD FOR RECORDING A MAGNETIC RESONANCE IMAGE

(75) Inventors: Bjoern Heismann, Erlangen (DE); Sebastian Schmidt, Weisendorf (DE)

(73) Assignee: Siemens Aktiengesellschaft, Munich (DE)

( * ) Notice: Subject to any disclaimer, the term of this patent is extended or adjusted under 35 U.S.C. 154(b) by 538 days.

(21) Appl. No.: 13/537,413

(22) Filed: Jun. 29, 2012

(65) Prior Publication Data

US 2013/0027038 A1     Jan. 31, 2013

(30) Foreign Application Priority Data

Jul. 27, 2011   (DE) .......................... 10 2011 079 920

(51) Int. Cl.
    *G01V 3/00*      (2006.01)
    *G01R 33/48*     (2006.01)
    *G01R 33/56*     (2006.01)

(52) U.S. Cl.
    CPC ............ *G01R 33/4824* (2013.01); *G01R 33/48* (2013.01); *G01R 33/56* (2013.01); *G01R 33/4816* (2013.01)

(58) Field of Classification Search
    CPC ........................................................ G01R 33/48
    USPC ........................................ 324/309, 307, 314
    See application file for complete search history.

(56) References Cited

U.S. PATENT DOCUMENTS 7,403,006 B2   7/2008  Garwood et al.
7,425,828 B2   9/2008  Garwood et al.
7,786,729 B2   8/2010  Chamberlain et al.
8,354,844 B2 * 1/2013  Zaitsev et al. ................ 324/307
8,502,537 B2 * 8/2013  Corum et al. ................. 324/314
8,519,707 B2 * 8/2013  Corum et al. ................. 324/307
2010/0244827 A1  9/2010  Hennel
2013/0043867 A1 * 2/2013  Corum et al. ................. 324/309

OTHER PUBLICATIONS

"Sweep Imaging with Fourier Transform (SWIFT)," Idiyatullin et al., Proc. Intl. Soc. Mag. Reson. Med. 14 (2006), p. 2433.
"Determining Optimum Imaging Parameters for SWIFT: Application to Superparamagnetic Iron Oxides and Magnetized Objects," O'Connell, Doctoral Dissertation, University of Minnesota (2011).

* cited by examiner

*Primary Examiner* — Louis Arana
(74) *Attorney, Agent, or Firm* — Schiff Hardin LLP

(57) ABSTRACT

In a method for recording a magnetic resonance image with a magnetic resonance device, in which several projection image data records are recorded in succession with different gradient orientations, from which, through back projection, the magnetic resonance image is reconstructed, the recording of a projection data record in a recording time frame proceeds with a temporal frequency modulated excitation pulse of a pulse duration, wherein, through the frequency modulation of the excitation pulse, all spins to be recorded within the scope of the projection data record are excited in a temporal sequence and wherein the frequency modulation function describing the frequency modulation during the pulse duration exhibits at least one maximum and/or at least one minimum. During the excitation duration, a time-resolved reception signal is detected. The projection data record is determined from the reception signal through evaluation.

13 Claims, 2 Drawing Sheets

METHOD FOR RECORDING A MAGNETIC RESONANCE IMAGE

BACKGROUND OF THE INVENTION

1. Field of the Invention

The present invention relates to a method for recording a magnetic resonance image with a magnetic resonance device, of the type wherein several projection image data records are recorded (acquired) in succession with different gradient orientations, from which, through back projection, the magnetic resonance image is reconstructed.

2. Description of the Prior Art

In magnetic resonance imaging, different techniques are known for recording magnetic resonance images. One technique only recently proposed is the so-called SWIFT technique (Sweep Imaging with Fourier Transform). A description of this imaging technique can be found in the article of the same name by D. Idiyatullin et al., Proc. Intl. Soc. Mag. Reson. Med. 14 (2006) 2433 and also in U.S. Pat. Nos. 7,425,828 B2 and 7,403,006 B2.

The basic idea of the SWIFT technique is to record a number of projection data records of a type that, similar to computed tomography, can then be pieced together via the back projection method into the actual magnetic resonance image. In the SWIFT technique, the projection data records are recorded in different recording time frames that differ with respect to the gradient orientation. The duration of a time frame of each recording corresponds to the repetition time TR, and in each recording time frame, a frequency-modulated excitation pulse is used with an excitation duration that differs from the repetition time, essentially by the time required to achieve a new orientation of the magnetic field gradients for the coding of the spatial information in the next frame. During the excitation duration, a time-resolved reception signal is recorded (detected), from which the projection data record can be determined. The frequency modulated pulse, which can be divided into a series of pulse segments, each of which are separated by a pulse pause in which a readout process of the reception coil can be performed, thus ultimately serves the purpose of "covering" regions exhibiting differing resonance frequencies on the basis of the gradient. The excitation frequency is continuously, monotonically increasingly altered as to the excitation duration from a minimum value to a maximum value, so that nuclear spins in different "strips" can be sequentially excited with differing resonance frequencies.

Thereafter, the orientation of the gradients is altered and the method is repeated in order to obtain data for the next projection. After the time-resolved reception signal contains the results of all excitations, an expansion must be performed which, for example, can be a cross-correlation method that can be developed identically to the method of restoration of phase information in stochastic magnetic resonance. Finally, the calculation of the magnetic resonance image is implemented by means of back projection or by Radon transform. Characteristic here is the "sweep", a continuous traversal of the regions in their physical sequence, which means the frequency modulation function is monotonically increasing or monotonically decreasing. In addition, an amplitude modulation is employed, using an amplitude modulation function that is the envelope in the case of the use of pulse segments. In the conventional, known process, a hyperbolic secant is proposed as the amplitude modulation function.

However, this known approach has a significant disadvantage with regard to the attainable image quality. With the use of a monotonically increasing frequency modulation function and a hyperbolic secant for the amplitude modulation, the pulse amplitude is greatest in the center of the image (projection data record). As a result, the image quality in the center strips is better than at the periphery. An additional disadvantageous effect is that the contrast (weighting) in the center of the image differs from the contrast at the periphery.

These disadvantages combine unfavorably with the properties of the image reconstruction, for example an inverse Radon transform, which produces a higher image quality in the center of the image than at the periphery of the image, since more data can be included in the calculation in the center and, as a result, the signal-noise ratio improves. This problem already has been known for some time, for example from computed tomography.

SUMMARY OF THE INVENTION

An object of the present invention is to address the problem by modification of the SWIFT technique to achieve a better image quality, particularly with respect to the homogeneity of the signal-noise ratio.

This object is achieved in accordance with the invention by a method of the type initially described wherein a projection data record is acquired in a recording time frame, with a temporal frequency-modulated excitation pulse of a pulse duration wherein, by the frequency modulation of the excitation pulse, all spins to be recorded within the scope of the projection data record are excited in a temporal sequence and wherein the frequency modulation function describing the frequency modulation during the pulse duration exhibits at least one maximum and/or at least one minimum. During the excitation duration, a time-resolved reception signal is detected. The projection data record is determined from the reception signal through evaluation.

In the present invention, the frequency modulation thus does not continuously pass through the frequency range, as is conventionally the case with a "sweep", but rather the frequency modulation deviates from a monotonically increasing or monotonically decreasing frequency modulation function, so that it becomes possible to optimize the frequency profile in such a way that the losses are compensated within the scope of the reconstruction. The image space of the projection data records is thus no longer continuously covered, but rather a frequency modulation function is used that exhibits at least one minimum and/or at least one maximum and hence can be purposefully designed so that it becomes possible to achieve a homogenization of the signal-to-noise ratio. An optimization can also be carried out with respect to other parameters that are relevant for determining the image quality, for example with regard to the resolution in different regions of the image.

In an embodiment of the invention, the frequency modulation function exhibits at least one branch. In this case a discontinuity thus exists, as a result of which it is possible to avoid, for example, having certain regions of the image space excited multiple times. More specifically, for example, frequency modulation, for example, may start at the center frequency and increase to a maximum frequency or decrease to a minimum frequency, and then branch to the minimum frequency or maximum frequency, and then increase or decrease to the center frequency. For example, the frequency profile can thus be such that, proceeding from the center frequency, which corresponds to the excitation of a central region, an edge of the image is "moved toward", after which the other edge of the image is branched to and again returns to the center in the form of the center frequency. This has the advantage that the excitation of the spins in the regions, which correspond to the edge of the image, occur with excitations of higher amplitude, in particular with pulse sequences of higher amplitude, which has a positive effect on the image quality.

In another embodiment of the inventive method, the excitation pulse exhibits pulse segments that can be separated by pulse pauses of equal length. Thus, an excitation does not occur continuously, but rather there are pulse pauses that, for example, can be used to measure the reception signal, namely the measurement of the reception signal can occur during the pulse pauses. In this way, an overloading of the coils is prevented, for example, when the excitation signal is received by the reception coil. The duration of a pulse segment can correspond to the duration of a pulse pause. Very short values, for example in the microsecond range, can be used.

In another embodiment of the present invention, the amplitude of the excitation pulse is temporally varied in accordance with the amplitude modulation function. If pulse segments are provided, the amplitude modulation function ultimately corresponds to the envelope of the segments. In accordance with the invention, it has now been recognized that a deviation from the hyperbolic secant known from the prior art can also be advantageous, since here a further degree of freedom exists in order to improve the image quality.

Thus, in a further embodiment of the inventive method, the amplitude is modulated so that, in the case of the excitation of interesting regions, a higher amplitude exists due to the frequency modulation than in the excitation of less interesting regions. If the pulse amplitude is in this way increased in the interesting regions, in particular in those image regions containing the important or critical image information, inevitably a higher signal-to-noise ratio also arises for these regions, so that the information in the interesting regions is especially reliable.

As mentioned, it is advantageous for the frequency modulation function and/or the amplitude modulation function to be selected so that a homogeneous flip angle excitation and/or the most homogeneous possible signal-to-noise ratio and/or the most homogeneous possible contrast arises in the magnetic resonance image. It is advantageous for the optimization of the frequency modulation function and the optimization of the amplitude modulation function to occur in parallel, since in this way there are more degrees of freedom. In general, the objective is to optimize the distribution of the pulse amplitude and the frequency profile in such a way that, particularly with regard to the properties of the image reconstruction, the most uniform possible signal-to-noise ratio and the most homogenous possible contrast arise over the entire magnetic resonance image. This can be achieved by deviating from a monotonically increasing or monotonically decreasing frequency modulation function, as has been determined within the scope of the present invention.

As initially mentioned, the reception signal contains the contributions of all regions of the image space of the projection data record, so that for evaluation of the reception signal a cross-correlation method can be used. A back projection method and/or an inverse Radon transform can be implemented as a reconstruction method for reconstruction of the magnetic resonance image from the projection data records. It is also within the scope of the present invention for the excitation duration with respect to the duration of the recording time frame to be shorter at least by the time required to switch the gradients. In this way, it is easily possible to receive the reception signal within the repetition time and switch to a new gradient orientation.

DESCRIPTION OF THE PREFERRED EMBODIMENTS

Figure 1:
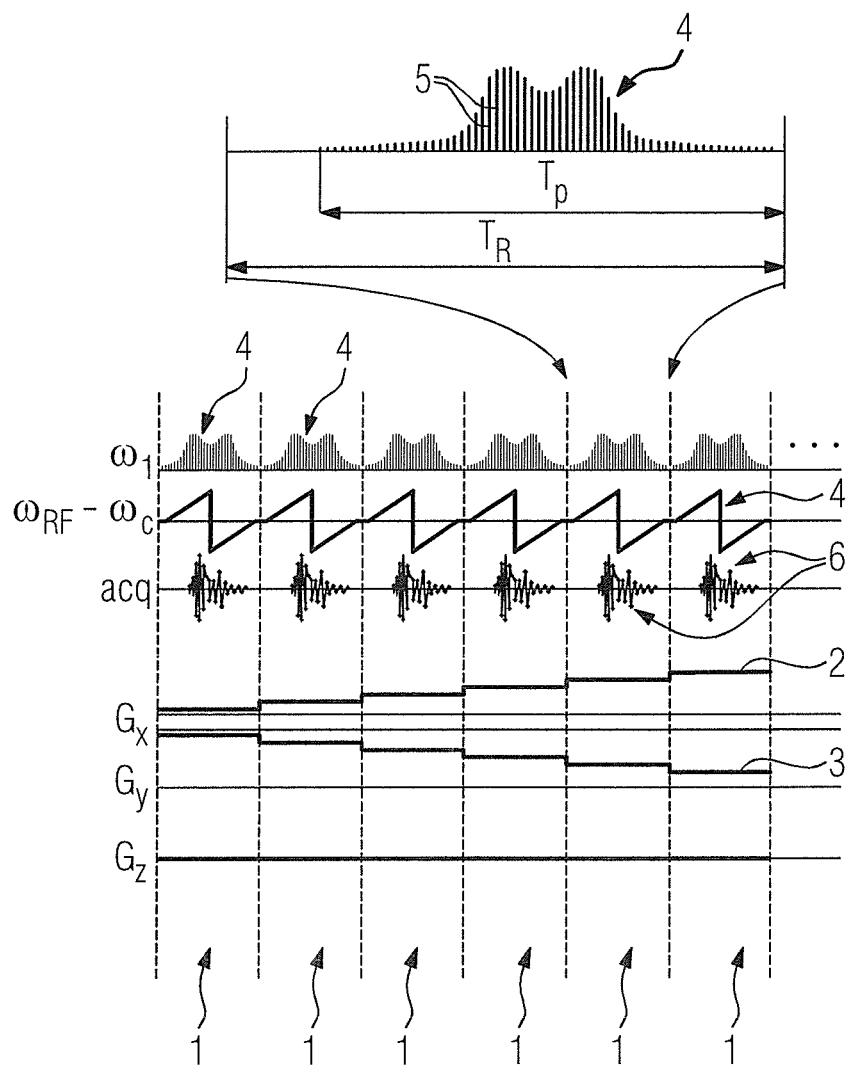
FIG. 1 is a schematic representation of the recording technique used in the inventive method.

FIG. 1 shows the profile of pulses and signals within the scope of the invention in the form of graphs, the method being able to be employed as an alternative to the SWIFT technique. As can be seen, the total recording operation is split up in recording time frames 1, in each frame of which a projection data record is acquired with a specific gradient orientation. As can be seen from graphs 2 and 3 for gradients $G_x$ and $G_y$, each recording time frame 1 has a different gradient orientation. An excitation of the spin in the image space occurs in the individual recording time frames 1 by means of an excitation pulse 4, which is both amplitude modulated and frequency modulated. The frequency modulation arises from the graph 4, in which case the center frequency $\omega_C$ is deducted from the excitation frequency $\omega_{RF}$ for clarity's sake. The excitation duration $T_P$ of pulse 4 is shorter than the repetition time $T_R$, to such an extent that the switching of the gradients apparent from graphs 2 and 3 can be performed outside of the excitation duration $T_P$.

As can be seen, the pulse 4 is composed of individual pulse segments 5, which are separated by pulse pauses in which the recording of the reception signal (acq) shown at 6 occurs. Ordinarily, in the process the duration of a pulse segment is followed by a recording duration that can be longer than the duration of the pulse segment, wherein then a further short pause can be provided until the next pulse segment.

The reception signals 6 are evaluated to the projection data records by means of a cross-correlation method, said projection data records from which the magnetic resonance image can be reconstructed using a reconstruction method, for example, the inverse Radon transform.

Figure 2:
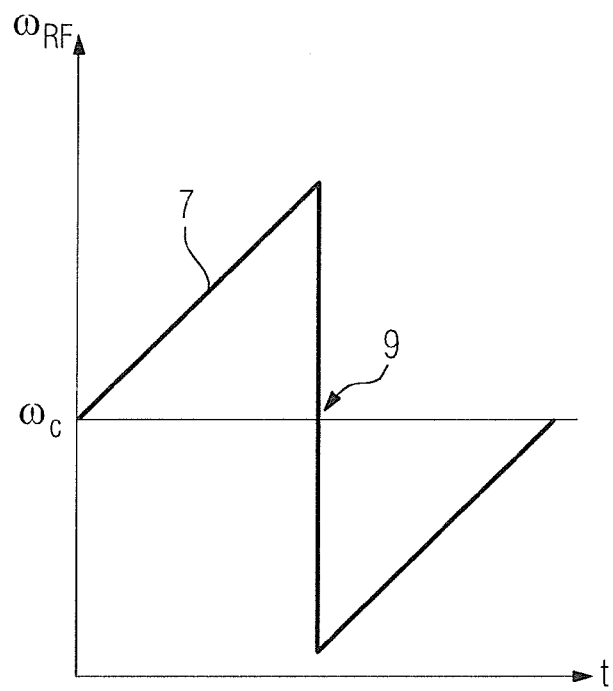
FIG. 2 shows an example of a profile of the frequency modulation function in accordance with the invention.
Figure 3:
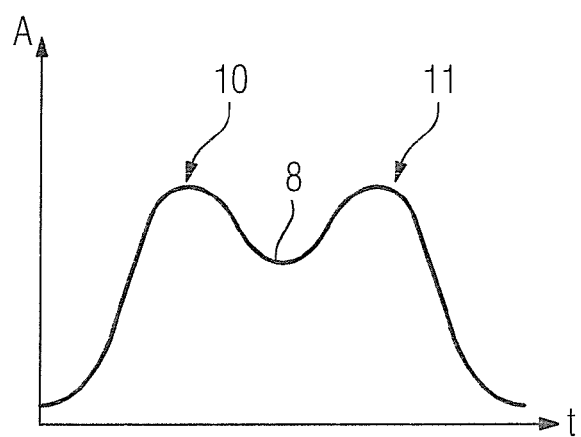
FIG. 3 shows an example of a profile of the amplitude modulation frequency in accordance with the invention.

In contrast to the SWIFT technique, the frequency modulation function 7, as shown in FIG. 2 and the amplitude modulation function 8, as shown in FIG. 3, are designed such that the most homogeneous possible signal-to-noise ratio and the most homogeneous possible contrast arise in the magnetic resonance image, within the reconstruction method used for determination of the magnetic resonance image being taken into consideration within the scope of this optimization.

In the frequency profile shown as an example in FIG. 2, the beginning is made at the center frequency $\omega_C$, which corresponds to the central regions of the image space of the projection data record. Proceeding from there, the frequency modulation function 7 increases to a maximum value, which corresponds to the edge of the image, in order then, after a branch 9, to branch to a minimum frequency which corresponds to the other edge of the image. From there the frequency modulation function once more increases to the center frequency $\omega_C$.

FIG. 3 shows an amplitude modulation function which in the present example exhibits two maxima 10, 11, which correspond to frequencies that excite the interesting regions. Hence, an optimization can also occur to this effect in the inventive method.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method for acquiring magnetic resonance image data, comprising:

operating a magnetic resonance data acquisition unit to, in each of a plurality of successive acquisition time frames, exciting nuclear spins in a subject located in the data acquisition unit by radiating an excitation pulse having a frequency duration, and temporally frequency modulating said excitation pulse to excite said nuclear spins in a temporal sequence within the respective acquisition time frame according to a non-linear frequency modulation function that defines said frequency modulation during said pulse duration, said non-linear frequency modulation function exhibiting at least one peak selected from the group consisting of a maximum peak and a minimum peak;

operating said magnetic resonance data acquisition unit to generate at least one gradient field and giving said at least one gradient field a different gradient field orientation respectively in each of said acquisition time frames;

operating said magnetic resonance data acquisition unit to detect, in each acquisition time frame, a magnetic resonance signal that arises from the excitation of nuclear spins in the respective acquisition time frame, thereby acquiring a plurality of time-resolved magnetic resonance signals;

supplying said time-resolved magnetic resonance signals to a computerized processor and, in said computerized processor, automatically generating a projection image data record for each acquisition time frame by evaluation of the respective time-resolved magnetic resonance signal detected in the respective acquisition time frame; and in said computerized processor, reconstructing a magnetic resonance image by back projection of the respective projection image data records.

2. A method as claimed in claim 1 employing, as said excitation pulse, an excitation pulse comprising pulse segments of equal duration, which are divided by pulse pauses.

3. A method as claimed in claim 2 comprising detecting said time-resolved magnetic resonance signals during the respective pulse pauses.

4. A method as claimed in claim 1 comprising employing, as said frequency modulation function, a frequency modulation function comprising at least one branch that produces a discontinuous excitation of said nuclear spins.

5. A method as claimed in claim 4 comprising employing a frequency modulation function that causes said frequency modulation to start at a center frequency and to temporally increase to a maximum frequency and then branch to a minimum frequency and then to increase to said center frequency.

6. A method as claimed in claim 4 comprising employing a frequency modulation function that causes said frequency modulation to start at a center frequency and decrease to a minimum frequency and then branch to a maximum frequency and then decrease to said center frequency.

7. A method as claimed in claim 1 comprising operating said magnetic resonance data acquisition unit to radiate said excitation pulse also according to an amplitude modulation function that temporally modulates an amplitude of said excitation pulse.

8. A method as claimed in claim 7 comprising selecting said amplitude modulation function to cause modulation of said amplitude of said excitation pulse to excite nuclear spins with a higher amplitude in a selected region of interest compared to excitation of nuclear spins in regions outside of said region of interest.

9. A method as claimed in claim 7 comprising selecting said amplitude modulation function to homogenize at least one of respective flip angles of nuclear spin excitation in the respective acquisition time frames, a signal-to-noise ratio of the respective magnetic resonance signals, and contrast in said magnetic resonance image.

10. A method as claimed in claim 7 comprising selecting said frequency modulation function and said amplitude modulation function to homogenize at least one of respective flip angles of nuclear spin excitation in the respective acquisition time frames, a signal-to-noise ratio of the respective magnetic resonance signals, and contrast in said magnetic resonance image.

11. A method as claimed in claim 1 comprising selecting said frequency modulation function to homogenize at least one of respective flip angles of nuclear spin excitation in the respective acquisition time frames, a signal-to-noise ratio of the respective magnetic resonance signals, and contrast in said magnetic resonance image.

12. A method as claimed in claim 1 comprising evaluating the respective magnetic resonance signals in said computerized processor using a cross-correlation method to produce the respective projection image data sets.

13. A method as claimed in claim 1 comprising operating said magnetic resonance data acquisition unit to radiate each excitation pulse in each acquisition time frame to produce a duration of excitation of said nuclear spins in the respective acquisition time frame that is less than at least a time required to operate said at least one gradient coil to produce the respective different gradient orientation in the respective acquisition time frame.

* * * * *